US012578402B2

(12) United States Patent
Isoda et al.

(10) Patent No.: US 12,578,402 B2
(45) Date of Patent: Mar. 17, 2026

(54) MAGNETIC SENSOR

(71) Applicant: TDK CORPORATION, Tokyo (JP)

(72) Inventors: Takehiro Isoda, Tokyo (JP); Norikazu Ota, Tokyo (JP); Kazuya Watanabe, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 150 days.

(21) Appl. No.: 18/541,031

(22) Filed: Dec. 15, 2023

(65) Prior Publication Data

US 2024/0310460 A1      Sep. 19, 2024

(30) Foreign Application Priority Data

Mar. 13, 2023      (JP) ................................. 2023-038569

(51) Int. Cl.
| | |
|---|---|
| *G01R 33/09* | (2006.01) |
| *H10N 50/01* | (2023.01) |
| *H10N 50/10* | (2023.01) |
| *H10N 50/80* | (2023.01) |

(52) U.S. Cl.
CPC ......... *G01R 33/091* (2013.01); *G01R 33/093* (2013.01); *H10N 50/01* (2023.02); *H10N 50/10* (2023.02); *H10N 50/80* (2023.02)

(58) Field of Classification Search
CPC .... G01R 33/091; G01R 33/093; H10N 50/80; H10N 50/01; H10N 50/10
See application file for complete search history.

(56) References Cited

U.S. PATENT DOCUMENTS

| | | | |
|---|---|---|---|
| 2009/0284254 A1 | 11/2009 | Kasajima | |
| 2011/0309829 A1* | 12/2011 | Loreit ...................... | G01D 1/00 |
| | | | 324/252 |
| 2016/0306015 A1 | 10/2016 | Yang et al. | |
| 2018/0087927 A1 | 3/2018 | Anagawa et al. | |
| 2018/0351083 A1* | 12/2018 | Sasaki .................. | G11C 11/1697 |
| 2019/0056459 A1 | 2/2019 | Uchida et al. | |
| 2019/0086485 A1 | 3/2019 | Uchida | |
| 2019/0301894 A1 | 10/2019 | Uchida | |
| 2021/0405132 A1 | 12/2021 | Kubota | |

FOREIGN PATENT DOCUMENTS

| | | |
|---|---|---|
| JP | 2001-102659 A | 4/2001 |
| JP | 2009-276159 A | 11/2009 |
| JP | 2013-032989 A | 2/2013 |

(Continued)

OTHER PUBLICATIONS

Feb. 12, 2025 English Translation of the Office Action issued in Japanese Patent Application No. 2023-038569.

*Primary Examiner* — Reena Aurora
(74) *Attorney, Agent, or Firm* — Oliff PLC

(57) ABSTRACT

A magnetic sensor includes a soft magnetic body having a first end surface and a second end surface located on opposite sides, a first MR element located near the first end surface, a second MR element located near the second end surface, and a first lead that electrically connects the first MR element and the second MR element and includes a portion overlapping the soft magnetic body when observed in a second direction orthogonal to a first direction in which the first and second MR elements are arranged.

16 Claims, 12 Drawing Sheets

(56)     References Cited

FOREIGN PATENT DOCUMENTS

| JP | 2018-054393 A | 4/2018 |
| JP | 2019-35686 A | 3/2019 |
| JP | 2019-056685 A | 4/2019 |
| WO | 2016/047782 A1 | 3/2016 |
| WO | 2020/250489 A1 | 12/2020 |

* cited by examiner

MAGNETIC SENSOR

CROSS REFERENCE TO RELATED APPLICATIONS

This application claims the benefit of Japanese Priority Patent Application No. 2023-038569 filed on Mar. 13, 2023, the entire contents of which are incorporated herein by reference.

BACKGROUND

The present technology relates to a magnetic sensor that includes a soft magnetic body and a magnetoresistive element.

Magnetic sensors have been used for a variety of applications. Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable depending on the direction of an applied magnetic field, and a gap layer located between the magnetization pinned layer and the free layer. In many cases, the spin-valve magnetoresistive element provided on a substrate is configured to have sensitivity to a magnetic field in a direction parallel to the surface of the substrate.

On the other hand, a system including a magnetic sensor may be intended to detect a magnetic field in a direction perpendicular to the surface of a substrate by using a magnetoresistive element provided on the substrate. Magnetic sensors including one or more magnetic field conversion elements formed of a soft magnetic body are known to serve such a purpose. The magnetic field conversion elements convert a magnetic field in a direction perpendicular to the surface of the substrate into a magnetic field in a direction parallel to the surface of the substrate, and supply the converted magnetic field to the magnetoresistive element. Such magnetic sensors are described in US 2019/0301894 A1, for example.

US 2019/0301894 A1 discloses a magnetic sensor that includes a magnetic field conversion unit, a plurality of magnetoresistive elements, and a wiring section. The magnetic field conversion unit includes a plurality of yokes. Each of the plurality of yokes has a shape that is long in one direction, and receives an input magnetic field and generates an output magnetic field. A plurality of magnetoresistive elements are arranged such that several magnetoresistive elements are located on both sides of each yoke. Each of the several magnetoresistive elements has a shape that is long in the longitudinal direction of each of the plurality of yokes. The wiring section connects the several magnetoresistive elements, which are arranged along the longitudinal direction of each of the plurality of yokes, in series.

An effective way of increasing the sensitivity of the magnetic sensor is to increase the area of occupancy of the magnetoresistive elements in the magnetic sensor. Meanwhile, with the miniaturization of devices including magnetic sensors, there has also been a demand for miniaturization of the magnetic sensors. Increasing the area of occupancy of the magnetoresistive elements or miniaturizing the magnetic sensor reduces the width of the wiring for electrically connecting the plurality of magnetoresistive elements. This reduction results in increased wiring resistance and a drop in the sensitivity of the magnetic sensor. Such a problem is particularly pronounced if the magnetic sensor includes wiring that connects a plurality of magnetoresistive elements that are arranged along a structure long in one direction, like a yoke, in series.

SUMMARY

A magnetic sensor according to one embodiment of the technology includes a soft magnetic body having a first end surface and a second end surface located on opposite sides, a first magnetoresistive element located near the first end surface, a second magnetoresistive element located near the second end surface, and a first lead that electrically connects the first magnetoresistive element and the second magnetoresistive element and includes a portion overlapping the soft magnetic body when observed in a second direction orthogonal to a first direction in which the first magnetoresistive element and the second magnetoresistive element are arranged.

In the magnetic sensor according to one embodiment of the technology, the first lead includes the portion overlapping the soft magnetic body. According to one embodiment of the technology, the resistance of wiring that electrically connects the plurality of magnetoresistive elements can thus be reduced.

Other and further objects, features and advantages of the present technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
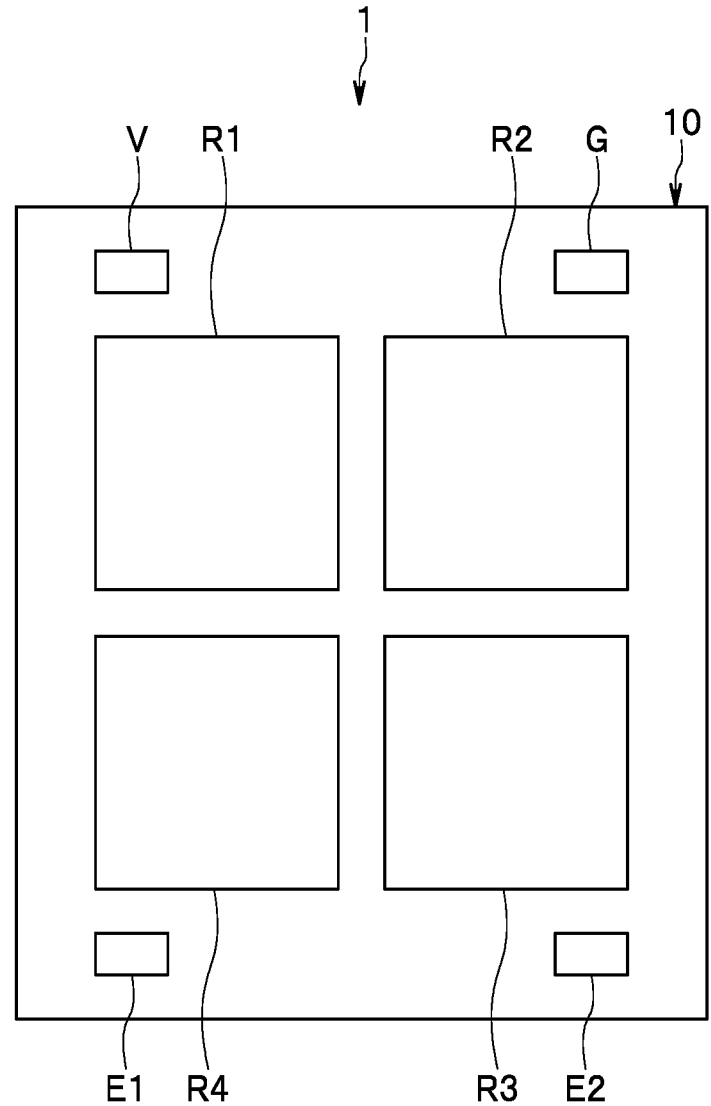
FIG. 1 is a plan view showing a magnetic sensor of a first example embodiment of the technology.

An object of the technology is to provide a magnetic sensor that can reduce the resistance of wiring that electrically connects a plurality of magnetoresistive elements.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
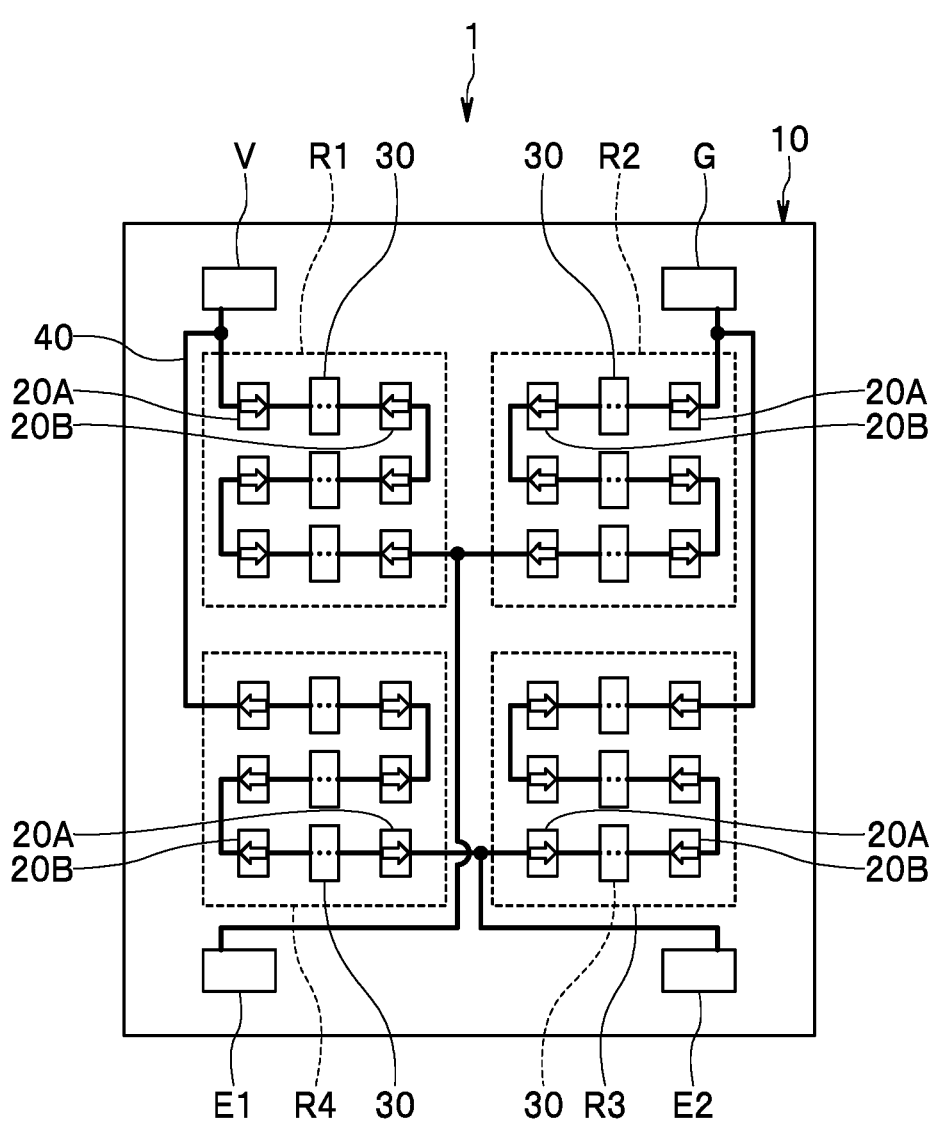
FIG. 2 is a plan view schematically showing wiring and a plurality of element pairs of the magnetic sensor according to the first example embodiment of the technology.
Figure 2:
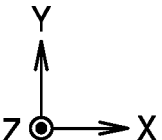
Figure 3:
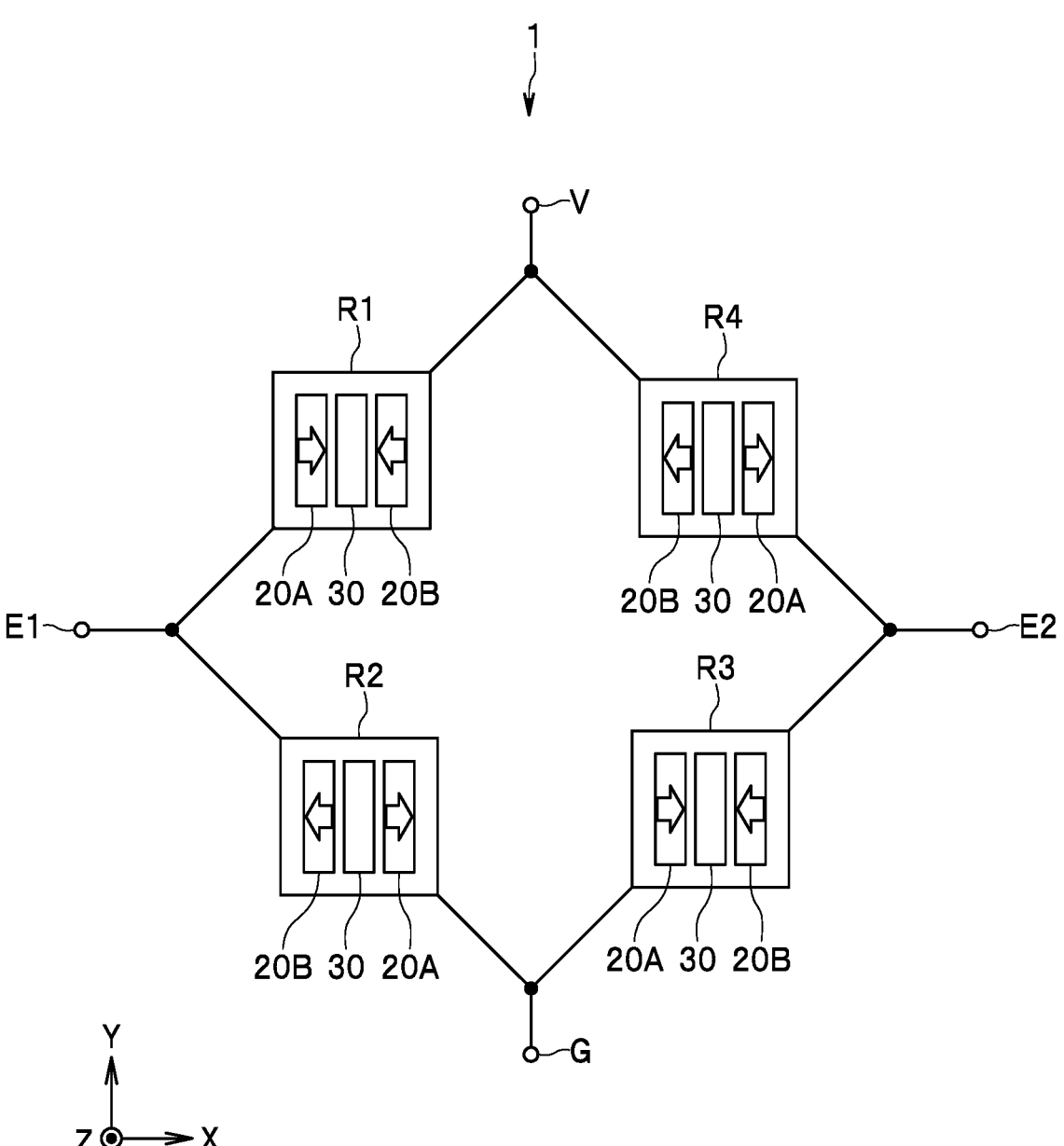
FIG. 3 is a circuit diagram showing a circuit configuration of the magnetic sensor according to the first example embodiment of the technology.

A schematic configuration of a magnetic sensor according to a first example embodiment of the technology will initially be described with reference to FIGS. 1 to 3. FIG. 1 is a plan view showing a magnetic sensor 1 according to the example embodiment. FIG. 2 is a plan view schematically showing wiring and a plurality of element pairs of the magnetic sensor 1 according to the example embodiment. FIG. 3 is a circuit diagram showing a circuit configuration of the magnetic sensor 1 according to the example embodiment.

The magnetic sensor 1 according to the example embodiment is used as a part of a geomagnetic sensor, for example. The magnetic sensor 1 includes a power supply port V, a ground port G, a first output port E1, a second output port E2, a first resistor section R1, a second resistor section R2, a third resistor section R3, and a fourth resistor section R4. The first to fourth resistor sections R1 to R4 each include a plurality of magnetoresistive elements (hereinafter, referred to as MR elements).

As shown in FIG. 3, the first resistor section R1 is provided between the power supply port V and the first output port E1 in a circuit configuration. The second resistor section R2 is provided between the ground port G and the first output port E1 in the circuit configuration. The third resistor section R3 is provided between the ground port G and the second output port E2 in the circuit configuration. The fourth resistor section R4 is provided between the power supply port V and the second output port E2 in the circuit configuration. Note that, in this application, the expression "in circuit configuration" is used to indicate a layout in a circuit diagram and not a layout in a physical configuration.

A voltage or current of a predetermined magnitude is applied to the power supply port V. The ground port G is connected to the ground.

Any three of the power supply port V, the ground port G, the first output port E1, and the second output port E2 correspond to a "first port", a "second port", and a "third port" according to the technology. For example, the power supply port V and the ground port G may correspond to the "first port" and the "third port", respectively. In such a case, the first output port E1 may correspond to the "second port". The second output port E2 may correspond to the "second port".

As shown in FIG. 2, the magnetic sensor 1 further includes wiring 40. The first resistor section R1 is electrically connected to the power supply port V and the first output port E1 by the wiring 40. The second resistor section R2 is electrically connected to the ground port G and the first output port E1 by the wiring 40. The third resistor section R3 is electrically connected to the ground port G and the second output port E2 by the wiring 40. The fourth resistor section R4 is electrically connected to the power supply port V and the second output port E2 by the wiring 40.

As shown in FIGS. 1 and 2, the magnetic sensor 1 further includes a substrate 10. The power supply port V, the ground port G, the first and second output ports E1 and E2, the first to fourth resistor sections R1 to R4, and the wiring 40 are disposed on the substrate 10.

Now, we define X, Y, and Z directions as shown in FIGS. 1 and 2. The X, Y, and Z directions are orthogonal to one another. The opposite directions to the X, Y, and Z directions will be referred to as –X, –Y, and –Z directions, respectively. In particular, in the example embodiment, a direction perpendicular to the surface of the substrate 10 is referred to as the Z direction.

As used herein, the term "above" refers to positions located forward of a reference position in the Z direction, and "below" refers to positions located on a side of the reference position opposite to "above". Concerning the components of the magnetic sensor 1, the term "top surface" refers to the surface located at the end in the Z direction, and the term "bottom surface" refers to the surface located at the end in the –Z direction. The expression "viewed in the Z direction" means that a target is viewed from a position away from the target in the Z direction.

FIGS. 1 and 2 show an example of the layout of the first to fourth resistor sections R1 to R4 on the substrate 10. In this example, the first and second resistor sections R1 and R2 are arranged in a direction parallel to the X direction along the end of the substrate 10 in the Y direction. The second resistor section R2 is located forward of the first resistor section R1 in the X direction.

The third and fourth resistor sections R3 and R4 are arranged in the direction parallel to the X direction along the end of the substrate 10 in the –Y direction. The fourth resistor section R4 is located forward of the third resistor section R3 in the –X direction. The third resistor section R3 is located forward of the second resistor section R2 in the –Y direction. The fourth resistor section R4 is located forward of the first resistor section R1 in the –Y direction.

The layout of the first to fourth resistor sections R1 to R4 on the substrate 10 is not limited to the example shown in FIGS. 1 and 2. For example, the first to fourth resistor sections R1 to R4 may be arranged in a predetermined order in the direction parallel to the X direction or in a direction parallel to the Y direction.

Figure 5:
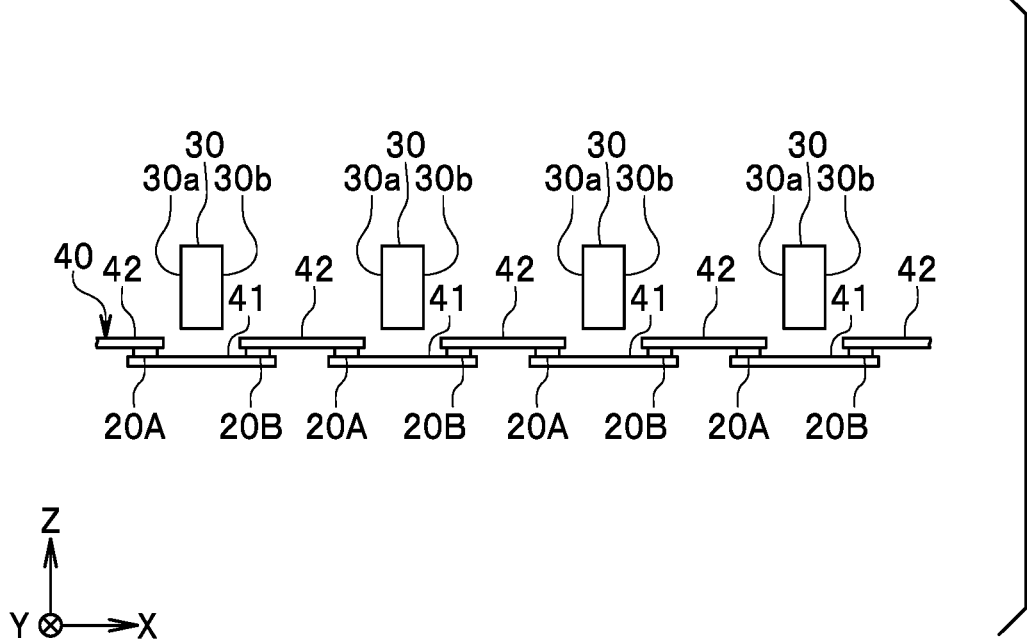
FIG. 5 is a side view showing a part of the magnetic sensor according to the first example embodiment of the technology.

Each of the first to fourth resistor sections R1 to R4 includes a plurality of soft magnetic structures each including a soft magnetic body 30, a plurality of element pairs each including a first MR element 20A, a second MR element 20B, and a first lead 41, and a plurality of second leads 42 that electrically connect the plurality of element pairs. The first and second leads 41 and 42 are shown in FIG. 5 to be described below. The first and second leads 41 and 42 constitute a part of the wiring 40.

For the sake of convenience, in FIG. 2, the number of the element pairs included in each of the first to fourth resistor sections R1 to R4 is three. However, the number of the element pairs included in each of the first to fourth resistor sections R1 to R4 may be more than three. In each of the first to fourth resistor sections R1 to R4, the first MR elements 20A and the second MR elements 20B are alternately electrically connected by the wiring 40 (first and second leads 41 and 42).

Figure 4:
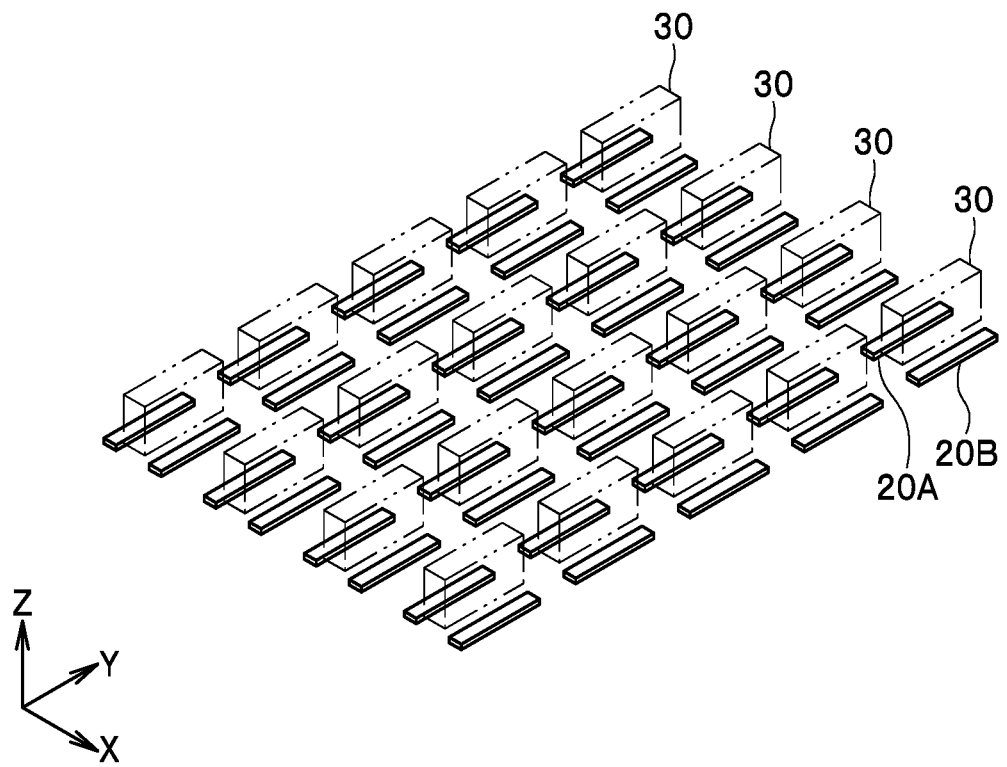
FIG. 4 is a perspective view showing a part of the magnetic sensor according to the first example embodiment of the technology.
Figure 6:
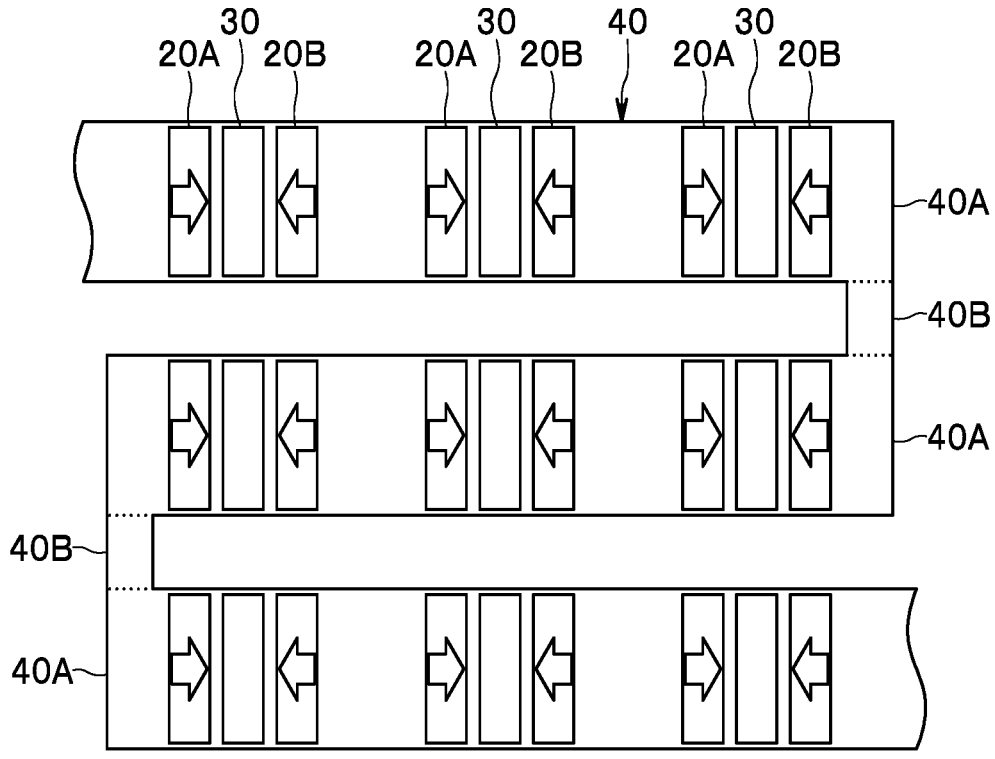
FIG. 6 is a plan view showing a part of the magnetic sensor according to the first example embodiment of the technology.
Figure 6:
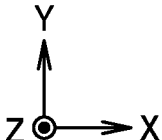

Next, the soft magnetic bodies 30, the first and second MR elements 20A and 20B, and the first and second leads 41 and 42 will be described in detail with reference to FIGS. 4 to 6. FIG. 4 is a perspective view showing a part of the magnetic sensor 1. FIG. 5 is a side view showing a part of the magnetic sensor 1. FIG. 6 is a plan view showing a part of the magnetic sensor 1. FIGS. 4 to 6 show a part of the first resistor section R1 or a part of the third resistor section R3 as the part of the magnetic sensor 1.

The soft magnetic bodies 30 are yokes configured to receive an input magnetic field containing an input magnetic field component in a direction parallel to the Z direction and generate an output magnetic field containing an output magnetic field component in the direction parallel to the X direction. The soft magnetic bodies 30 have a rectangular solid shape that is long in the Y direction, for example. In the example embodiment, each of the plurality of soft magnetic structures includes only a soft magnetic body 30. However, the plurality of soft magnetic structures may each include soft magnetic bodies other than the soft magnetic body 30. The other soft magnetic bodies may have the same shape as that of the soft magnetic body 30 or a shape different from that of the soft magnetic body 30.

Each soft magnetic body 30 has a first end surface 30a and a second end surface 30b located on opposite sides. As shown in FIG. 5, in the first and third resistor sections R1 and R3, the first end surface 30a is located at the end of the soft magnetic body 30 in the –X direction. The second end surface 30b is located at the end of the soft magnetic body 30 in the X direction. Although not shown, in the second and fourth resistor sections R2 and R4, the first end surface 30a is located at the end of the soft magnetic body 30 in the X direction. The second end surface 30b is located at the end of the soft magnetic body 30 in the –X direction.

Conversely to the example shown in FIG. 5, in the first and third resistor sections R1 and R3, the first end surface 30a may be located at the end of the soft magnetic body 30 in the X direction, and the second end surface 30b may be located at the end of the soft magnetic body 30 in the –X direction. In such a case, in the second and fourth resistor sections R2 and R4, the first end surface 30a is located at the end of the soft magnetic body 30 in the –X direction, and the second end surface 30b is located at the end of the soft magnetic body 30 in the X direction.

Each of the first and second MR elements 20A and 20B is located at a position where the output magnetic field component occurring from the soft magnetic body 30 can be detected. The first MR element 20A is located near the first end surface 30a of the soft magnetic body 30. The second MR element 20B is located near the second end surface 30b of the soft magnetic body 30. In particular, in the present example embodiment, the number of the plurality of soft magnetic structures (soft magnetic bodies 30) is the same as the number of the plurality of element pairs. A soft magnetic body 30 is located between a first MR element 20A and a second MR element 20B, which together constitute an element pair. Each of the first and second MR elements 20A and 20B is located below the soft magnetic body 30. Each of the first and second MR elements 20A and 20B has a shape that is long in the Y direction.

The plurality of soft magnetic bodies 30 are arranged so that several soft magnetic bodies 30 form a line in both the X and Y directions. The plurality of element pairs, corresponding to the plurality of soft magnetic bodies 30, are arranged so that several element pairs form lines in both the X and Y directions.

Now, an element pair will be described with reference to FIG. 5. In an element pair, the first MR element 20A and the second MR element 20B are arranged in the direction parallel to the X direction. The first MR element 20A and the second MR element 20B are electrically connected by the first lead 41. In the example shown in FIG. 5, the first lead 41 is positioned so that the first and second MR elements 20A and 20B are located between the first lead 41 and the soft magnetic body 30, and the first lead 41 is connected to the bottom surface of the first MR element 20A and the bottom surface of the second MR element 20B.

When observed in the Z direction, the first lead 41 includes a portion overlapping the soft magnetic body 30. More specifically, the first lead 41 extends to pass under the soft magnetic body 30 and connects the first MR element 20A and the second MR element 20B. In particular, in the example embodiment, the first lead 41 extends in the X direction.

Next, two element pairs that are arranged adjacently in the X direction will be described with reference to FIG. 5. One of the two element pairs will hereinafter be referred to as a first element pair, and the other of the two element pairs as a second element pair. A second lead 42 electrically connects one of the first and second MR elements 20A and 20B of the first element pair to the second element pair without any interposed MR element.

In the example shown in FIG. 5, i.e., in the first and third resistor sections R1 and R3, a specific second lead 42 electrically connects the first MR element 20A of the first element pair to the second MR element 20B of the second element pair adjoining the first MR element 20A of the first element pair in the –X direction without any interposed MR element. The second MR element 20B of the first element pair is not directly connected to the second element pair.

Another specific second lead 42 electrically connects the second MR element 20B of the first element pair to the first MR element 20A of another second element pair adjoining the second MR element 20B of the first element pair in the X direction without any interposed MR element. The first MR element 20A of the first element pair is not directly connected to another second element pair.

The foregoing description of two element pairs that are arranged adjacently in the X direction in the first and third resistor sections R1 and R3 also applies to the second and fourth resistor sections R2 and R4. A description of two element pairs that are arranged adjacently in the X direction in the second and fourth resistor sections R2 and R4 is given by replacing the first MR element 20A and the second MR element 20B with each other in the description of the two element pairs that are arranged adjacently in the X direction in the first resistor section R1 or the third resistor section R3.

Next, the shape of the wiring 40 will be described with reference to FIG. 6. In each of the first to fourth resistor sections R1 to R4, a plurality of first leads 41 and a plurality of second leads 42 constitute a part of the wiring 40. In the first to fourth resistor sections R1 to R4, the wiring 40 has a meandering shape when observed in the Z direction.

As shown in FIG. 6, the wiring 40 includes a plurality of first portions 40A and a plurality of second portions 40B. In FIG. 6, the borders between the first portions 40A and the second portions 40B are shown in dotted lines. Each of the plurality of first portions 40A extends in the direction parallel to the X direction. The plurality of first portions 40A are arranged in the Y direction. Each of the plurality of first portions 40A is constituted by a plurality of first leads 41 and a plurality of second leads 42.

Each of the plurality of second portions 40B connects two first portions 40A that are arranged adjacently in the Y direction. Each of the plurality of second portions 40B is constituted by a part of a second lead 42.

Next, two element pairs (first element pair and second element pair) that are arranged adjacently in the Y direction will be described with reference to FIG. 6. A first element pair located near one longitudinal end of a first portion 40A is connected to a second element pair located near one longitudinal end of another first portion 40A. A second lead 42 (a part of the first portion 40A, a part of another first portion 40A, and a second portion 40B) electrically connects one of the first and second MR elements 20A and 20B of the first element pair to the second element pair without any interposed MR element.

In the example shown in FIG. 6, i.e., in the first resistor section R1 or the third resistor section R3, a specific second lead 42 electrically connects the first MR element 20A of the first element pair located near one end, in the −X direction, of a specific first portion 40A located at the vertical center in FIG. 6 to the first MR element 20A of a second element pair adjoining the first MR element 20A of the first element pair in the −Y direction without any interposed MR element. The second MR element 20B of the first element pair is not directly connected to the second element pair.

Another specific second lead 42 electrically connects the second MR element 20B of another first element pair located near one end of the specific first portion 40A in the X direction to the second MR element 20B of another second element pair adjoining the second MR element 20B of the above-described another first element pair in the Y direction without any interposed MR element. The first MR element 20A of another first element pair is not directly connected to another second element pair 20B.

At least one element pair other than the two element pairs located near both longitudinal ends of the first portion 40A is not directly connected to another element pair arranged adjacently in the Y direction or the −Y direction.

If FIG. 6 shows a part of the first resistor section R1, the foregoing description may also apply to the third resistor section R3. Alternatively, in the third resistor section R3, a specific second lead 42 may electrically connect the first MR element 20A of a first element pair located near one end of a specific first portion 40A in the −X direction to the first MR element 20A of a second element pair adjoining the first MR element 20A of the first element pair in the Y direction. Another specific second lead 42 may electrically connect the second MR element 20B of another first element pair located near one end of the specific first portion 40A in the X direction to the second MR element 20B of another second element pair adjoining the second MR element 20B of the above-described another first element pair in the −Y direction.

The foregoing description of two element pairs that are arranged adjacently in the Y direction in the first and third resistor sections R1 and R3 also applies to the second and fourth resistor sections R2 and R4. A description of two element pairs that are arranged adjacently in the Y direction in the second and fourth resistor sections R2 and R4 is given by replacing the first MR element 20A and the second MR element 20B with each other in the description of the two element pairs that are arranged adjacently in the Y direction in the first and third resistor sections R1 and R3.

Next, the shapes of the first MR elements 20A, the second MR elements 20B, and the wiring 40 (first and second leads 41 and 42) will be described with reference to FIG. 6. The first MR elements 20A, the second MR elements 20B, and the wiring 40 each have a width that is a dimension in the direction parallel to the Y direction. The width of the first MR elements 20A is also the longitudinal dimension of the first MR elements 20A. The width of the second MR elements 20B is also the longitudinal dimension of the second MR elements 20B.

In each of the first to fourth resistor sections R1 to R4, the wiring 40 (first and second leads 41 and 42) includes a portion where the width of the wiring 40 (widths of the first and second leads 41 and 42) is greater than or equal to the width of each of the first and second MR elements 20A and 20B. As shown in FIG. 6, the first portions 40A of the wiring 40 may have a constant width. Alternatively, the first portions 40A of the wiring 40 may have a variable width.

For the sake of convenience, in FIG. 6, the dimension of the soft magnetic bodies 30 in the direction parallel to the Y direction is shown to be smaller than the width of the wiring 40. However, the foregoing dimension of the soft magnetic bodies 30 may be greater than or equal to the width of the wiring 40.

Figure 7:
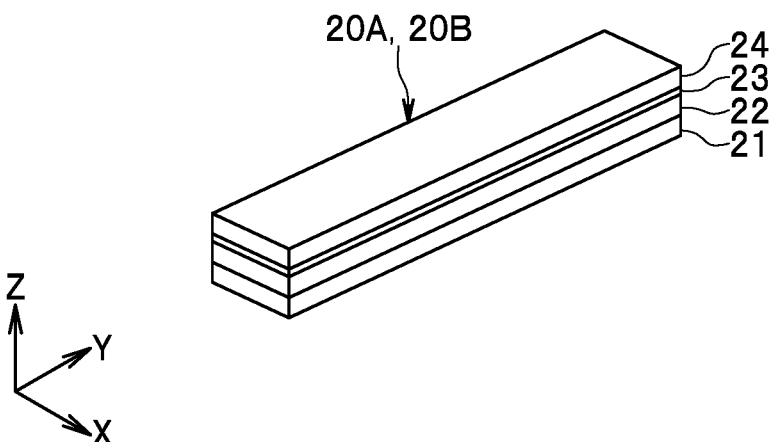
FIG. 7 is a perspective view showing a magnetoresistive element of the first example embodiment of the technology.

Next, a configuration of the first and second MR elements 20A and 20B will be described with reference to FIG. 7. FIG. 7 is a perspective view showing the first and second MR elements 20A and 20B. The first and second MR elements 20A and 20B have the same configuration except for the magnetization directions of their magnetization pinned layers to be described below.

The first and second MR elements 20A and 20B are both a spin-valve MR element. Each of the first and second MR elements 20A and 20B includes a magnetization pinned layer 22 having a magnetization in a fixed direction, a free layer 24 having a magnetization whose direction is variable depending on the direction of an applied magnetic field, and a gap layer 23 located between the magnetization pinned layer 22 and the free layer 24. The first and second MR elements 20A and 20B may be a tunneling magnetoresistive (TMR) element or a giant magnetoresistive (GMR) element. In the TMR element, the gap layer 23 is a tunnel barrier layer. In the GMR element, the gap layer 23 is a nonmagnetic conductive layer. The resistance of each of the first and second MR elements 20A and 20B changes with the angle that the magnetization direction of the free layer 24 forms with respect to the magnetization direction of the magnetization pinned layer 22. The resistance of each of the first and second MR elements 20A and 20B is at its minimum value when the foregoing angle is 0°, and at its maximum value when the foregoing angle is 180°.

Each of the first and second MR elements 20A and 20B is elongated in shape in a direction parallel to the Y direction. The free layer 24 of each of the first and second MR elements 20A and 20B thus has shape anisotropy such that a direction of a magnetization easy axis is parallel to the Y direction. When there is no applied magnetic field, the direction of the magnetization of the free layer 24 is thus parallel to the Y direction. If there is an output magnetic field component in the direction parallel to the X direction, the direction of the magnetization of the free layer 24 varies depending on the direction and strength of the output magnetic field component. The angle that the direction of the magnetization of the free layer 24 forms with respect to the direction of the magnetization of the magnetization pinned layer 22 thus varies depending on the direction and strength of the output magnetic field component received by each of the first and second MR elements 20A and 20B. The resistance of each of the first and second MR elements 20A and 20B thus corresponds to the output magnetic field component. The direction of the magnetization easy axis can be set to the direction parallel to the Y direction by providing a magnet for applying a bias magnetic field to the free layer 24 regardless of the shape anisotropy, i.e., a bias magnetic field due to the shape anisotropy.

Each of the first and second MR elements 20A and 20B further includes an antiferromagnetic layer 21. The antiferromagnetic layer 21, the magnetization pinned layer 22, the gap layer 23, and the free layer 24 are stacked in this order. The antiferromagnetic layer 21 is formed of an antiferromagnetic material, and is in exchange coupling with the magnetization pinned layer 22 to thereby pin the magnetization direction of the magnetization pinned layer 22. The magnetization pinned layer 22 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 22 is the self-pinned layer, the antiferromagnetic layer 21 may be omitted.

It should be appreciated that the layers 21 to 24 of each of the first and second MR elements 20A and 20B may be stacked in the reverse order to that shown in FIG. 7.

Next, the magnetization directions of the magnetization pinned layers 22 will be described with reference to FIGS. 2 and 3. The magnetization of the magnetization pinned layer 22 of the first MR element 20A contains a component in a first magnetization direction. The magnetization of the magnetization pinned layer 22 of the second MR element 20B contains a component in a second magnetization direction opposite to the first magnetization direction. In particular, in the example embodiment, the first magnetization direction is the X direction, and the second magnetization direction is the –X direction. In FIGS. 2 and 3, the arrows drawn on the first MR elements 20A indicate the first magnetization direction. The arrows drawn on the second MR elements 20B indicate the second magnetization direction.

Note that, when the magnetization of the magnetization pinned layer 22 contains a component in a specific magnetization direction, the component in the specific magnetization direction may be a main component of the magnetization of the magnetization pinned layer 22. Alternatively, the magnetization of the magnetization pinned layer 22 may not contain a component in a direction orthogonal to the specific magnetization direction. In the present example embodiment, when the magnetization of the magnetization pinned layer 22 contains the component in the specific magnetization direction, the magnetization of the magnetization pinned layer 22 direction is the specific magnetization direction or substantially the specific magnetization direction.

Next, the order of arrangement of the first and second MR elements 20A and 20B in each of the first to fourth resistor sections R1 to R4 will be described with reference to FIGS. 2 and 3. In the first and third resistor sections R1 and R3, the first MR element 20A and the second MR element 20B in each of the plurality of element pairs are arranged in this order in the X direction. In the second and fourth resistor sections R2 and R4, the first MR element 20A and the second MR element 20B in each of the plurality of element pairs are arranged in this order in the –X direction. That is, in the example embodiment, the order of arrangement, in the direction parallel to the X direction, of the first and second MR elements 20A and 20B in the plurality of element pairs of the first and third resistor sections R1 and R3 is opposite to the order of arrangement of the first and second MR elements 20A and 20B in the plurality of element pairs of the second and fourth resistor sections R2 and R4.

Next, the at least one detection signal generated by the magnetic sensor 1 will be described in detail with reference to FIGS. 2 and 3. When there is no input magnetic field component and, as a result, no output magnetic field component, the direction of the magnetization of the free layer 24 of each of the first and second MR elements 20A and 20B is parallel to the Y direction. In the first and third resistor sections R1 and R3, if the direction of the input magnetic field component is the Z direction, the direction of the output magnetic field component that the first MR element 20A receives is the X direction, and the direction of the output magnetic field component that the second MR element 20B receives is the –X direction. In such a case, the magnetization direction of the free layer 24 of the first MR element 20A tilts from the direction parallel to the Y direction toward the X direction. Furthermore, the magnetization direction of the free layer 24 of the second MR element 20B tilts from the direction parallel to the Y direction toward the –X direction. As a result, the resistance of each of the first and second MR elements 20A and 20B decreases and the resistance of each of the first and third resistor sections R1 and R3 also decreases as compared to a case without the output magnetic field components.

In the second and fourth resistor sections R2 and R4, if the direction of the input magnetic field component is the Z direction, the direction of the output magnetic field component that the first MR element 20A receives is the –X direction, and the direction of the output magnetic field component that the second MR element 20B receives is the X direction. In such a case, the magnetization direction of the free layer 24 of the first MR element 20A tilts from the direction parallel to the Y direction toward the –X direction. The magnetization direction of the free layer 24 of the second MR element 20B tilts from the direction parallel to the Y direction toward the X direction. As a result, the resistance of each of the first and second MR elements 20A and 20B increases and the resistance of each of the second and fourth resistor sections R2 and R4 also increases as compared to a case without the output magnetic field components.

If the direction of the input magnetic field component is the –Z direction, the directions of the output magnetic field components and the changes in the resistances of the respective first to fourth resistor sections R1 to R4 are opposite to those in the foregoing case where the direction of the input magnetic field component is the Z direction.

The amount of change in the resistance of each of the first and second MR elements 20A and 20B depends on the strength of the output magnetic field component that each of the first and second MR elements 20A and 20B receives. As the strength of the output magnetic field component increases, the resistance of each of the first and second MR elements 20A and 20B changes so that the amount of increase or decrease thereof increases. As the strength of the output magnetic field component decreases, the resistance of each of the first and second MR elements 20A and 20B changes so that the amount of increase or decrease thereof decreases. The strength of the output magnetic field component depends on that of the input magnetic field component.

As described above, changes in the direction and strength of the input magnetic field component cause the resistances of the first to fourth resistor sections R1 to R4 to change such that the resistances of the first and third resistor sections R1 and R3 increase while the resistances of the second and fourth resistor sections R2 and R4 decrease, or such that the resistances of the first and third resistor sections R1 and R3 decrease while the resistances of the second and fourth resistor sections R2 and R4 increase. This changes the potentials of the respective first and second output ports E1 and E2 shown in FIGS. 1 to 3. The magnetic sensor 1 generates two signals corresponding to the potentials of the first and second output ports E1 and E2 or a signal corresponding to a potential difference between the first and second output ports E1 and E2 as the at least one detection signal. The at least one detection signal varies depending on the angles that the directions of the magnetization of the free layers 24 form with respect to the directions of the magnetization of the magnetization pinned layers 22.

Next, other configurations of the magnetic sensor 1 according to the example embodiment will be briefly described. Although not shown in the drawings, the components of the magnetic sensor 1 excluding the substrate 10 are stacked on the substrate 10 along with a not-shown insulating layer disposed around the components of the magnetic sensor 1 excluding the substrate 10. The power supply port V, the ground port G, and the first and second output ports E1 and E2 are formed in a manner where they are exposed and not covered by the not-shown insulating layer.

Next, a manufacturing method for the magnetic sensor 1 according to the present example embodiment will be briefly described. The manufacturing method of the magnetic sensor 1 includes a step of forming the plurality of first MR elements 20A and the plurality of second MR elements 20B on the substrate 10, and a step of forming the wiring 40.

In the step of forming the plurality of the first MR elements 20A and the plurality of the second MR elements 20B, a plurality of initial MR elements to later become the plurality of the first MR elements 20A and the plurality of the second MR elements 20B are initially formed. Each of the plurality of initial MR elements includes at least an initial magnetization pinned layer to later become a magnetization pinned layer 22, and a free layer 24 and a gap layer 23.

Next, the magnetization directions of the initial magnetization pinned layers are fixed to predetermined directions using laser light and external magnetic fields in the foregoing predetermined directions. For example, a plurality of initial MR elements to later become the plurality of the first MR elements 20A are irradiated with laser light while an external magnetic field in the first magnetization direction (X direction) is applied thereto. When the irradiation with the laser light is completed, the magnetization directions of the initial magnetization pinned layers are fixed to the first magnetization direction. This makes the initial magnetization pinned layers into the magnetization pinned layers 22, and the plurality of initial MR elements into the plurality of the first MR elements 20A.

In a plurality of other initial MR elements to later become the plurality of the second MR elements 20B, the magnetization direction of the initial magnetization pinned layer in each of the plurality of other initial MR elements can be fixed to the second magnetization direction (−X direction)

by setting the direction of the external magnetic field to the second magnetization direction. The plurality of the second MR elements 20B are formed in such a manner.

Next, the operation and effects of the magnetic sensor 1 according to the present example embodiment will be described. The magnetic sensor 1 according to the example embodiment includes the soft magnetic body 30 having the first end surface 30a and the second end surface 30b located on opposite sides, the first MR element 20A located near the first end surface 30a, the second MR element 20B located near the second end surface 30b, and the first lead 41 that electrically connects the first MR element 20A and the second MR element 20B. In the example embodiment, the first lead 41 includes a portion overlapping the soft magnetic body 30 when observed in the Z direction. According to the example embodiment, the resistance of the wiring 40 can thus be reduced as compared to the case where the wiring 40 is formed to not overlap the soft magnetic body 30.

Figure 8:
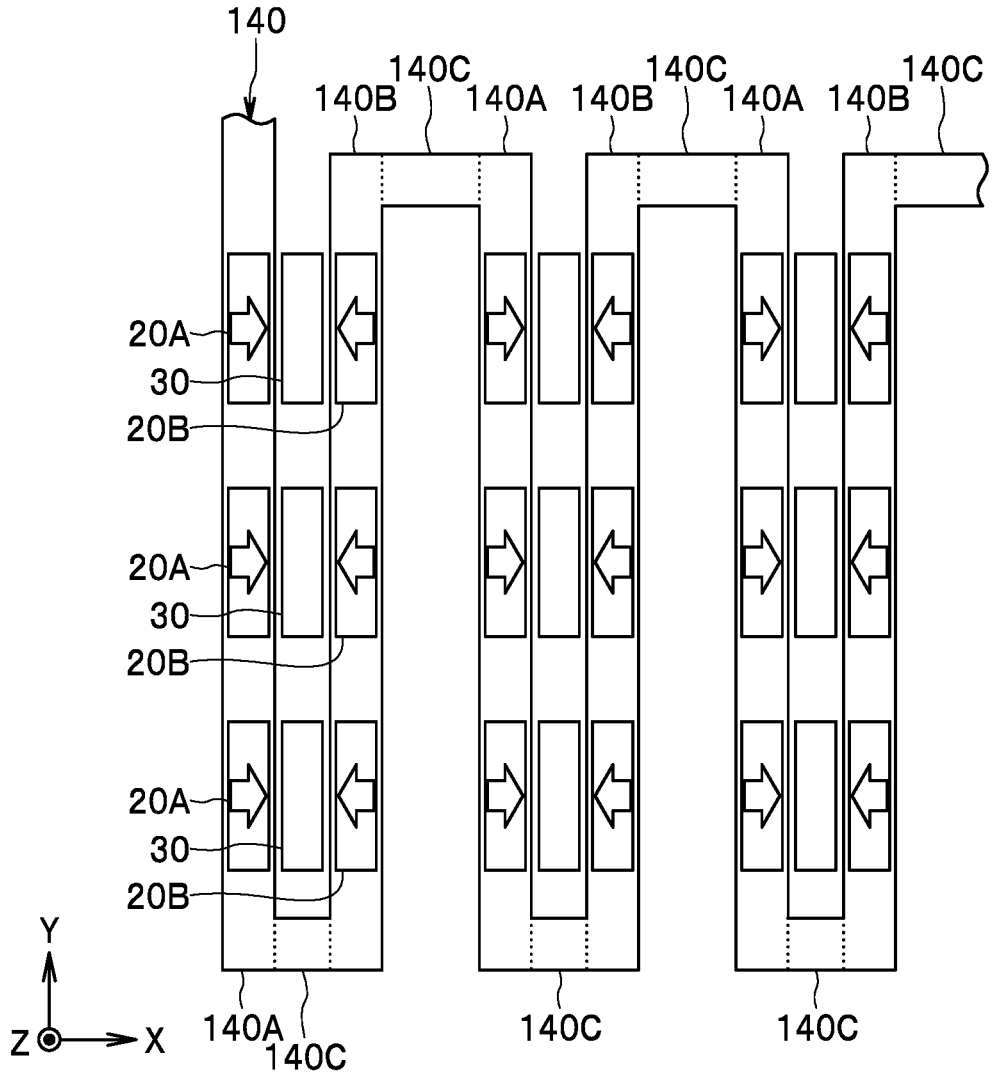
FIG. 8 is a plan view showing a part of a magnetic sensor of a comparative example.

FIG. 8 is a plan view showing a part of a magnetic sensor of a comparative example, including wiring 140 of the comparative example. FIG. 8 shows a portion corresponding to a part of the first resistor section R1 or a part of the third resistor section R3 in the example embodiment. When observed in the Z direction, the wiring 140 of the comparative example has a meandering shape.

The wiring 140 of the comparative example includes a plurality of first portions 140A each electrically connecting a plurality of first MR elements 20A arranged in the Y direction, a plurality of second portions 140B each electrically connecting a plurality of second MR elements 20B arranged in the Y direction, and third portions 140C each connecting a first portion 140A and a second portion 140B that are arranged adjacently in the X direction. In FIG. 8, the borders between the first portions 140A and the third portions 140C and the borders between the second portions 140B and the third portions 140C are both shown in dotted lines.

The width (transverse dimension) of each of the plurality of first portions 140A is substantially the same as the transverse dimension of the first MR elements 20A. The width (transverse dimension) of each of the plurality of second portions 140B is substantially the same as the transverse dimension of the second MR elements 20B. In the magnetic sensor of the comparative example, the resistance of the wiring 140 is thus relatively high.

By contrast, in the example embodiment, as shown in FIG. 6, the width (transverse dimension) of the wiring 40 can be substantially the same as the longitudinal dimension of each of the first and second MR elements 20A and 20B, i.e., the width of each of the first and second MR elements 20A and 20B. According to the example embodiment, the resistance of the wiring 40 can thus be reduced compared to the comparative example.

Moreover, according to the example embodiment, the resistance of the wiring 40 can be made relatively small, given the same area of occupancy of the first and second MR elements 20A and 20B in the magnetic sensor 1. The sensitivity of the magnetic sensor 1 can thus be increased. According to the example embodiment, the resistance of the wiring 40 can be prevented from increasing even if the area of occupancy of the first and second MR elements 20A and 20B in the magnetic sensor 1 is reduced. According to the example embodiment, since the resistance of the wiring 40 can be made small compared to the comparative example, the magnetic sensor 1 can be miniaturized by reducing the area of occupancy of the first and second MR elements 20A and 20B while maintaining the sensitivity of the magnetic sensor 1.

Modification Example

Figure 9:
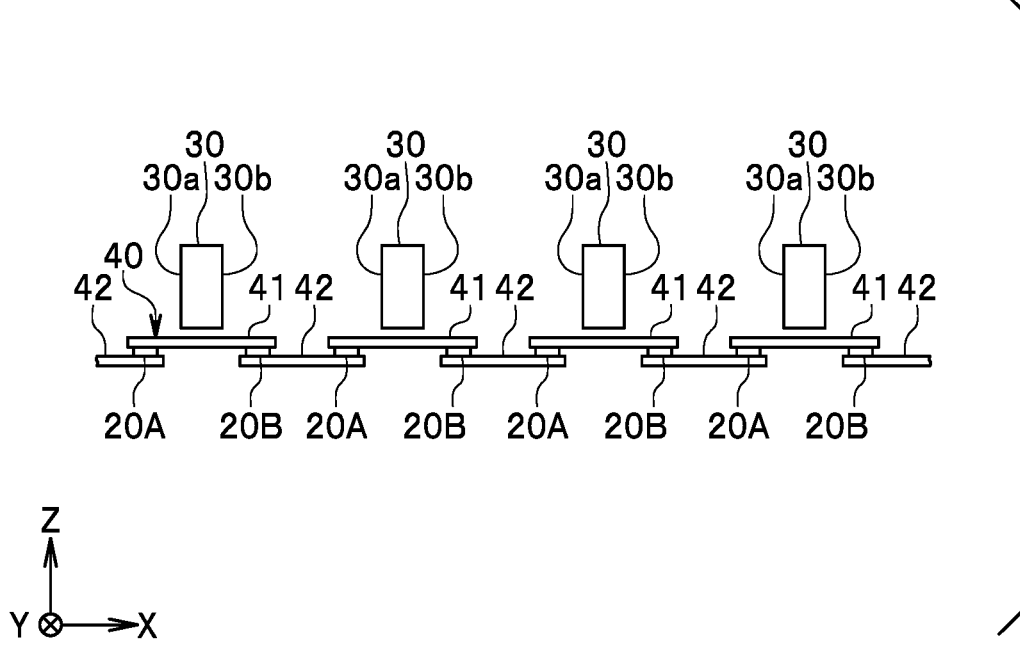
FIG. 9 is a side view showing a part of a modification example of the magnetic sensor according to the first example embodiment of the technology.

Next, a modification example of the magnetic sensor 1 according to the present example embodiment will be described with reference to FIG. 9. FIG. 9 is a side view corresponding to FIG. 5. In the modification example, the first leads 41 are located between the soft magnetic bodies 30 and the first and second MR elements 20A and 20B and connected to the top surfaces of the first MR elements 20A and the top surfaces of the second MR elements 20B.

Second Example Embodiment

Figure 10:
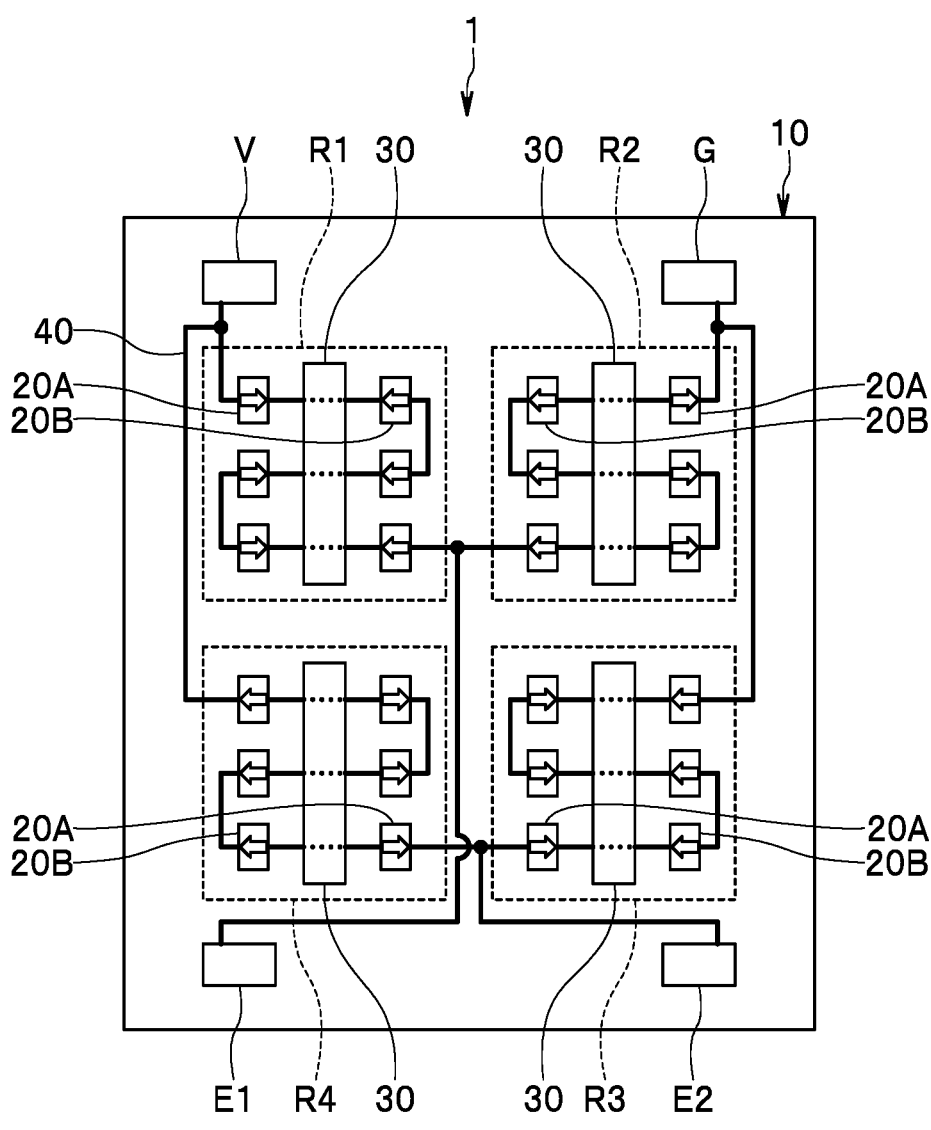
FIG. 10 is a plan view schematically showing wiring and a plurality of element pairs of a magnetic sensor according to a second example embodiment of the technology.
Figure 10:
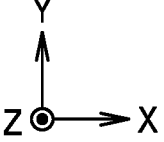

A second example embodiment of the technology will now be described with reference to FIG. 10. FIG. 10 is a plan view schematically showing wiring and a plurality of element pairs of a magnetic sensor according to the example embodiment.

In the example embodiment, the number of a plurality of soft magnetic structures (soft magnetic bodies 30) is smaller than that of a plurality of element pairs. A soft magnetic body 30 is located between a plurality of first MR elements 20A and a plurality of second MR elements 20B which together constitute a plurality of element pairs arranged in the Y direction.

Each of first to fourth resistor sections R1 to R4 includes at least one soft magnetic body 30. If the at least one soft magnetic body 30 is a plurality of soft magnetic bodies 30, the plurality of soft magnetic bodies 30 may be arranged in the X direction in each of the first to fourth resistor sections R1 to R4.

The configuration, operation, and effects of the present example embodiment are otherwise the same as those of the first example embodiment.

Third Example Embodiment

Figure 11:
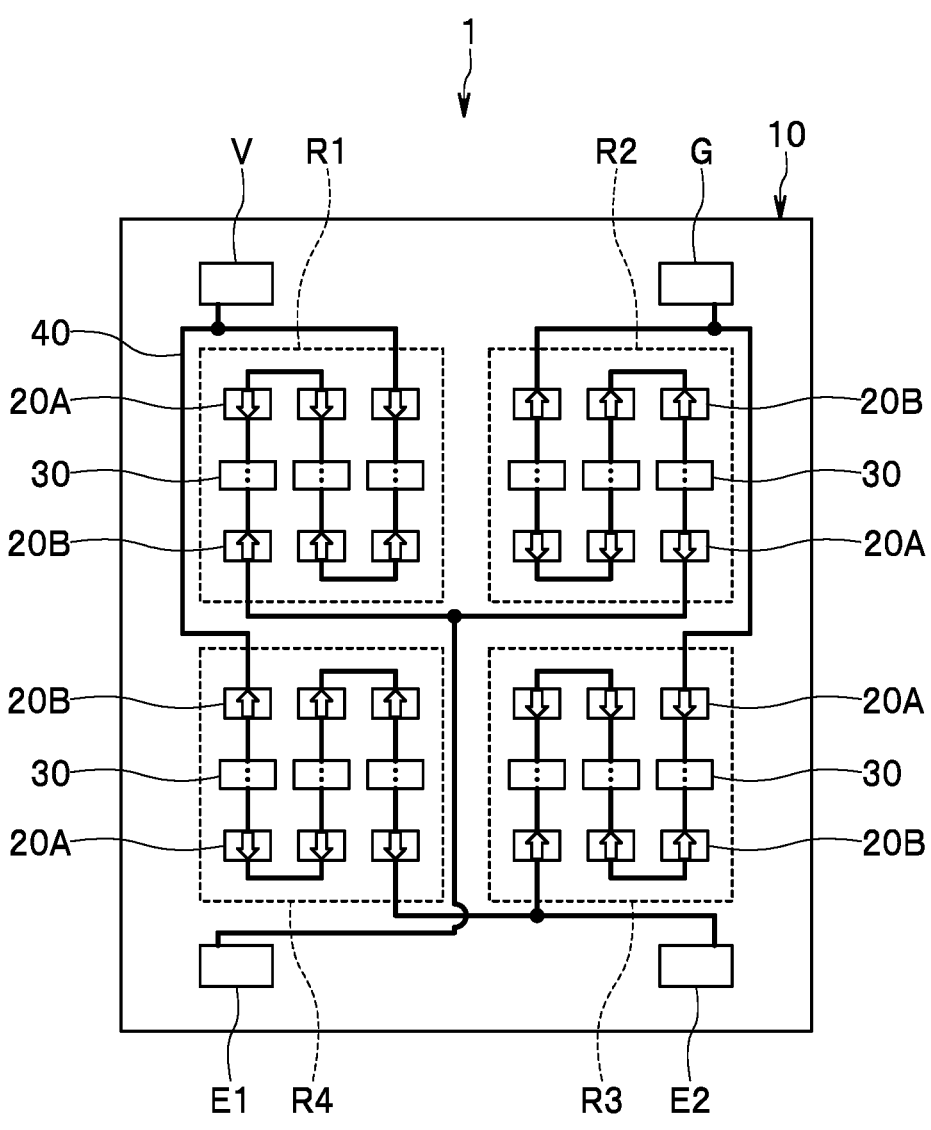
FIG. 11 is a plan view schematically showing wiring and a plurality of element pairs of a magnetic sensor according to a third example embodiment of the technology.
Figure 11:
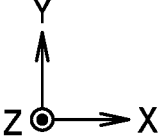

A third example embodiment of the technology will now be described with reference to FIG. 11. FIG. 11 is a plan view schematically showing wiring and a plurality of element pairs of a magnetic sensor according to the example embodiment.

In the example embodiment, the orientation of a plurality of soft magnetic structures (soft magnetic bodies 30) and the orientation of a plurality of element pairs in each of first to fourth resistor sections R1 to R4 are different from those in the first example embodiment. When observed in the Z direction, the orientation of the plurality of soft magnetic structures (soft magnetic bodies 30) and the orientation of the plurality of element pairs are rotated 90° clockwise from those described in the first example embodiment.

In the example embodiment, the soft magnetic bodies 30 are configured to receive an input magnetic field containing an input magnetic field component in a direction parallel to the Z direction and generate an output magnetic field containing an output magnetic field component in a direction parallel to the Y direction. The soft magnetic bodies 30 have a rectangular solid shape that is long in the X direction, for example.

In the first and third resistor sections R1 and R3, a first end surface 30a of each soft magnetic body 30 is located at the end of the soft magnetic body 30 in the –Y direction. A second end surface 30b of the soft magnetic body 30 is located at the end of the soft magnetic body 30 in the Y direction. In the second and fourth resistor sections R2 and R4, the first end surface 30a of each soft magnetic body 30 is located at the end of the soft magnetic body 30 in the Y direction. The second end surface 30b of the soft magnetic body 30 is located at the end of the soft magnetic body 30 in the –Y direction.

Each of the first and second MR elements 20A and 20B has a shape that is long in the X direction. The first and second MR elements 20A and 20B in an element pair are arranged in the direction parallel to the Y direction. Although not shown, first leads 41 extend in the Y direction.

In the example embodiment, the first magnetization direction is the –Y direction, and the second magnetization direction is the Y direction. In other words, in the example embodiment, the magnetization of the magnetization pinned layer 22 of the first MR element 20A contains a component in the –Y direction. The magnetization of the magnetization pinned layer 22 of the second MR element 20B contains a component in the Y direction.

In the first and third resistor sections R1 and R3, the first and second MR elements 20A and 20B in each of the plurality of element pairs are arranged in this order in the –Y direction. In the second and fourth resistor sections R2 and R4, the first and second MR elements 20A and 20B in each of the plurality of element pairs are arranged in this order in the Y direction.

The relationship between the directions of the output magnetic field components and the changes in the resistances of the respective first to fourth resistor sections R1 to R4 is the same as that in the first example embodiment.

The configuration, operation, and effects of the present example embodiment are otherwise the same as those of the first example embodiment.

Fourth Example Embodiment

Figure 12:
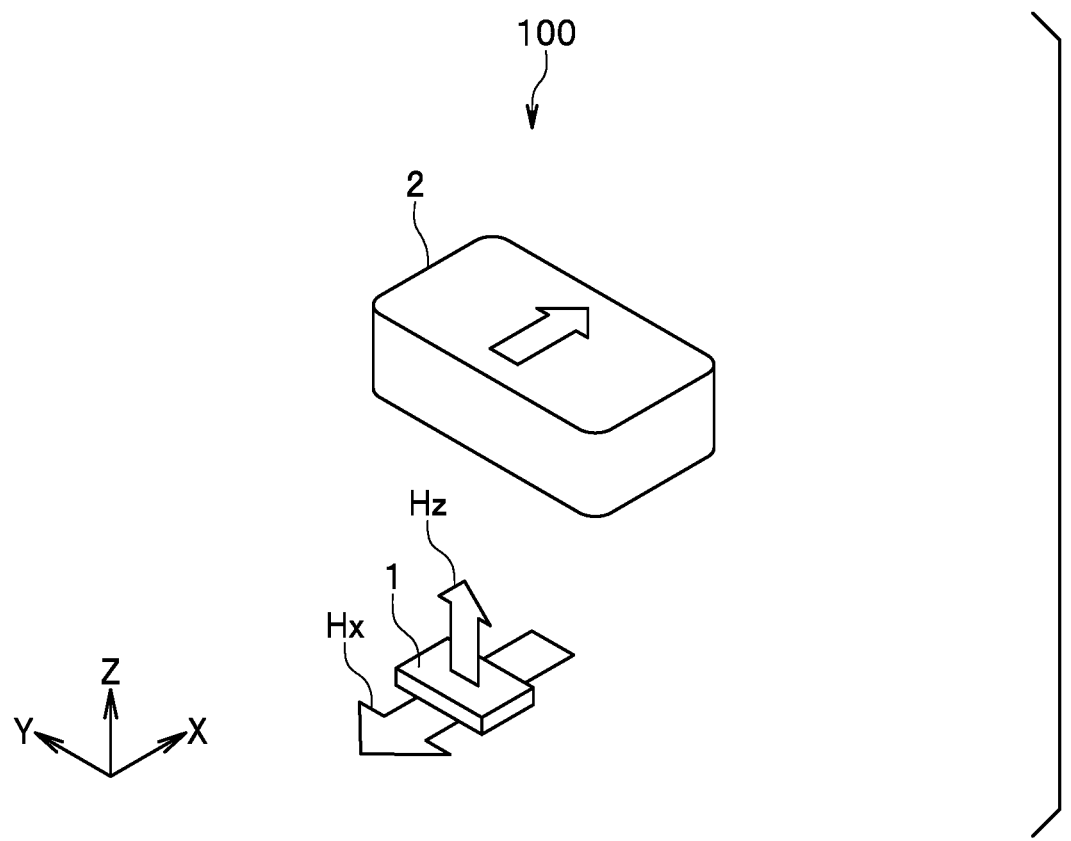
FIG. 12 is a perspective view showing a magnetic sensor system of a fourth example embodiment of the technology.

A fourth example embodiment of the technology will now be described with reference to FIG. 12. FIG. 12 is a perspective view showing a magnetic sensor system of the example embodiment.

A magnetic sensor system 100 includes a magnetic sensor 1 and a magnetic field generation unit that generates a predetermined magnetic field.

In the example embodiment, the magnetic field generation unit is a magnet 2 configured so that a part of the magnetic field generated, or a partial magnetic field, is applied to the magnetic sensor 1. The partial magnetic field contains a first magnetic field component Hz parallel to the Z direction and a second magnetic field component Hx parallel to the X direction.

The magnet 2 is magnetized in the X direction, and the second magnetic field component Hx is in the –X direction. The first magnetic field component Hz is in the Z direction if the magnet 2 moves in the X direction from a predetermined position, and the –Z direction if the magnet 2 moves in the –X direction from the predetermined position.

The magnetic sensor 1 in the magnetic sensor system 100 may be the magnetic sensor 1 according to any one of the first to third example embodiments. In such a case, the magnetic sensor 1 is configured to detect the first magnetic field component Hz.

The configuration, operation, and effects of the present example embodiment are otherwise the same as those of any of the first to third example embodiments.

The technology is not limited to the foregoing example embodiments, and various modifications may be made thereto. For example, the shapes, arrangement, and numbers of soft management bodies 30, first MR elements 20A, second MR elements 20B, first leads 41, and second leads 42 are not limited to the examples described in the example embodiments, and may be freely determined as long as the requirements of the claims are satisfied.

The soft magnetic bodies 30 may be located below the first MR elements 20A, the second MR elements 20B, the first leads 41, and the second leads 42. In such a case, the first leads 41 extend over the soft magnetic bodies 30 and connect the first MR elements 20A and the second MR elements 20B.

As described above, a magnetic sensor according to the technology includes: a soft magnetic body having a first end surface and a second end surface located on opposite sides; a first magnetoresistive element located near the first end surface; a second magnetoresistive element located near the second end surface; and a first lead that electrically connects the first magnetoresistive element and the second magnetoresistive element and includes a portion overlapping the soft magnetic body when observed in a second direction orthogonal to a first direction in which the first magnetoresistive element and the second magnetoresistive element are arranged.

In the magnetic sensor according to the technology, each of the first magnetoresistive element and the second magnetoresistive element may include a magnetization pinned layer having a magnetization in a predetermined direction and a free layer having a magnetization whose direction is variable depending on an applied magnetic field. The magnetization of the magnetization pinned layer of the first magnetoresistive element may contain a component in a first magnetization direction. The magnetization of the magnetization pinned layer of the second magnetoresistive element may contain a component in a second magnetization direction opposite to the first magnetization direction.

In the magnetic sensor according to the technology, each of the first magnetoresistive element and the second magnetoresistive element may have a shape that is long in a third direction intersecting both the first direction and the second direction.

In the magnetic sensor according to the technology, each of the first magnetoresistive element and the second magnetoresistive element may include a magnetization pinned layer having a magnetization in a predetermined direction and a free layer having a magnetization whose direction is variable depending on an applied magnetic field, and be configured so that a bias magnetic field is applied to the free layer in a direction intersecting both the first direction and the second direction.

In the magnetic sensor according to the technology, each of the first magnetoresistive element, the second magnetoresistive element, and the first lead may have a width that is a dimension in a third direction intersecting both the first direction and the second direction. The first lead may include a portion where the width of the first lead is greater than or equal to the width of each of the first magnetoresistive element and the second magnetoresistive element.

In the magnetic sensor according to the technology, the soft magnetic body may be a yoke configured to receive an input magnetic field containing a component in a direction parallel to the second direction and generate an output magnetic field containing a component in a direction parallel to the first direction.

In the magnetic sensor according to the technology, the first lead may be disposed at a position between the soft magnetic body and the first and second magnetoresistive elements or at a position where the first and second magnetoresistive elements are located between the first lead and the soft magnetic body.

The magnetic sensor according to the technology may further include: a plurality of soft magnetic structures each including the soft magnetic body; a plurality of element pairs each including the first magnetoresistive element, the second magnetoresistive element, and the first lead; and a plurality of second leads that electrically connect the plurality of element pairs.

If the magnetic sensor according to the technology includes the plurality of soft magnetic structures, the plurality of element pairs, and the plurality of second leads, the plurality of element pairs may include adjoining first and second element pairs. The plurality of second leads may include a specific second lead that electrically connects either one of the first magnetoresistive element and the second magnetoresistive element of the first element pair to the second element pair without any interposed magnetoresistive element. The other of the first magnetoresistive element and the second magnetoresistive element of the first element pair may be electrically connected to the second element pair via the one of the first magnetoresistive element and the second magnetoresistive element of the first element pair. The first element pair and the second element pair may be arranged in the first direction. The specific second lead may electrically connect the second magnetoresistive element of the first element pair and the first magnetoresistive element of the second element pair.

If the plurality of element pairs include the adjoining first and second element pairs, the first element pair and the second element pair may be arranged in a third direction intersecting both the first direction and the second direction. The specific second lead may electrically connect the first magnetoresistive element of the first element pair and the first magnetoresistive element of the second element pair.

If the plurality of element pairs include the adjoining first and second element pairs, the plurality of soft magnetic structures may include a first soft magnetic body that is the soft magnetic body located between the first magnetoresistive element and the second magnetoresistive element of the first element pair and a second soft magnetic body that is the soft magnetic body located between the first magnetoresistive element and the second magnetoresistive element of the second element pair. The first magnetoresistive element and the second magnetoresistive element of the first element pair may be located closer to the first soft magnetic body than to the second soft magnetic body.

If the magnetic sensor according to the technology includes the plurality of soft magnetic structures, the plurality of element pairs, and the plurality of second leads, the magnetic sensor according to the technology may further include a first port, a second port, and a third port. The plurality of element pairs may include at least one first element pair provided between the first port and the second port in a circuit configuration and at least one second element pair provided between the second port and the third port in the circuit configuration. Each of the first magnetoresistive element and the second magnetoresistive element may include a magnetization pinned layer having a magnetization in a predetermined direction and a free layer having a magnetization whose direction is variable depending on an applied magnetic field. The magnetization of the magnetization pinned layer of the first magnetoresistive element may contain a component in a first magnetization direction. The magnetization of the magnetization pinned layer of the second magnetoresistive element may contain a component in a second magnetization direction opposite to the first magnetization direction. The order of arrangement, in the first direction, of the first magnetoresistive element and the second magnetoresistive element of the at least one first element pair may be opposite to the order of arrangement of the first magnetoresistive element and the second magnetoresistive element of the at least one second element pair.

A manufacturing method of the magnetic sensor according to the technology includes a step of forming the first magnetoresistive element and the second magnetoresistive element. Each of the first magnetoresistive element and the second magnetoresistive element includes a magnetization pinned layer having a magnetization in a predetermined direction and a free layer having a magnetization whose direction is variable depending on an applied magnetic field. The step of forming the first magnetoresistive element and the second magnetoresistive element includes: a step of forming a plurality of initial magnetoresistive elements each including an initial magnetization pinned layer to later become the magnetization pinned layer and the free layer; and a step of fixing a direction of the magnetization of the initial magnetization pinned layer of an initial magnetoresistive element to later become the first magnetoresistive element among the plurality of initial magnetoresistive elements and fixing a direction of the magnetization of the initial magnetization pinned layer of an initial magnetoresistive element to later become the second magnetoresistive element among the plurality of initial magnetoresistive elements by using laser light and an external magnetic field.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor comprising:
   a soft magnetic body having a first end surface and a second end surface located on opposite sides;
   a first magnetoresistive element located outward of the first end surface;
   a second magnetoresistive element located outward of the second end surface; and
   a first lead that electrically connects the first magnetoresistive element and the second magnetoresistive element and includes a portion overlapping the soft magnetic body when observed in a second direction orthogonal to a first direction in which the first magnetoresistive element and the second magnetoresistive element are arranged,
   wherein:
   each of the first magnetoresistive element and the second magnetoresistive element includes a magnetization pinned layer having a magnetization in a predetermined direction and a free layer having a magnetization whose direction is variable depending on an applied magnetic field;
   the magnetization of the magnetization pinned layer of the first magnetoresistive element contains a component of the magnetization in a first magnetization direction; and
   the magnetization of the magnetization pinned layer of the second magnetoresistive element contains a component of the magnetization in a second magnetization direction opposite to the first magnetization direction.

2. The magnetic sensor according to claim 1, wherein each of the first magnetoresistive element and the second magnetoresistive element has a shape that is long in a third direction intersecting both the first direction and the second direction.

3. The magnetic sensor according to claim 1, wherein each of the first magnetoresistive element and the second magnetoresistive element is configured so that a bias magnetic field is applied to the free layer in a direction intersecting both the first direction and the second direction.

4. The magnetic sensor according to claim 1, wherein:
   each of the first magnetoresistive element, the second magnetoresistive element, and the first lead has a width that is a dimension in a third direction intersecting both the first direction and the second direction; and
   the first lead includes a portion where the width of the first lead is greater than or equal to the width of each of the first magnetoresistive element and the second magnetoresistive element.

5. The magnetic sensor according to claim 1, wherein the soft magnetic body is a yoke configured to receive an input magnetic field containing a component in a direction parallel to the second direction and generate an output magnetic field containing a component in a direction parallel to the first direction.

6. The magnetic sensor according to claim 1, wherein the first lead is disposed at a position between the soft magnetic body and the first and second magnetoresistive elements or at a position where the first and second magnetoresistive elements are located between the first lead and the soft magnetic body.

7. The magnetic sensor according to claim 1, further comprising:
   a plurality of soft magnetic structures each including the soft magnetic body;
   a plurality of element pairs each including the first magnetoresistive element, the second magnetoresistive element, and the first lead; and
   a plurality of second leads that electrically connect the plurality of element pairs.

8. The magnetic sensor according to claim 7, wherein:
   the plurality of element pairs include adjoining first and second element pairs;
   the plurality of second leads include a specific second lead that electrically connects either one of the first magnetoresistive element and the second magnetoresistive element of the first element pair to the second element pair without any interposed magnetoresistive element; and
   the other of the first magnetoresistive element and the second magnetoresistive element of the first element pair is electrically connected to the second element pair via the one of the first magnetoresistive element and the second magnetoresistive element of the first element pair.

9. The magnetic sensor according to claim 8, wherein the first element pair and the second element pair are arranged in the first direction.

10. The magnetic sensor according to claim 9, wherein the specific second lead electrically connects the second magnetoresistive element of the first element pair and the first magnetoresistive element of the second element pair.

11. The magnetic sensor according to claim 8, wherein the first element pair and the second element pair are arranged in a third direction intersecting both the first direction and the second direction.

12. The magnetic sensor according to claim 11, wherein the specific second lead electrically connects the first magnetoresistive element of the first element pair and the first magnetoresistive element of the second element pair.

13. The magnetic sensor according to claim 8, wherein:

the plurality of soft magnetic structures include a first soft magnetic body that is the soft magnetic body located between the first magnetoresistive element and the second magnetoresistive element of the first element pair and a second soft magnetic body that is the soft magnetic body located between the first magnetoresistive element and the second magnetoresistive element of the second element pair; and the first magnetoresistive element and the second magnetoresistive element of the first element pair are located closer to the first soft magnetic body than to the second soft magnetic body.

14. The magnetic sensor according to claim 7, further comprising:

a first port;

a second port; and a third port, wherein:

the plurality of element pairs include at least one first element pair provided between the first port and the second port in a circuit configuration and at least one second element pair provided between the second port and the third port in the circuit configuration.

15. The magnetic sensor according to claim 14, wherein:

an order of arrangement, in the first direction, of the first magnetoresistive element and the second magnetoresistive element of the at least one first element pair is opposite to order of arrangement of the first magnetoresistive element and the second magnetoresistive element of the at least one second element pair.

16. A manufacturing method of the magnetic sensor according to claim 1, the manufacturing method comprising a step of forming the first magnetoresistive element and the second magnetoresistive element, the step of forming the first magnetoresistive element and the second magnetoresistive element including:

a step of forming a plurality of initial magnetoresistive elements each including an initial magnetization pinned layer to later become the magnetization pinned layer and the free layer; and a step of fixing a direction of the magnetization of the initial magnetization pinned layer of an initial magnetoresistive element to later become the first magnetoresistive element among the plurality of initial magnetoresistive elements and fixing a direction of the magnetization of the initial magnetization pinned layer of an initial magnetoresistive element to later become the second magnetoresistive element among the plurality of initial magnetoresistive elements by using laser light and an external magnetic field.

* * * * *